United States Patent
Arai et al.

(10) Patent No.: US 11,270,984 B2
(45) Date of Patent: Mar. 8, 2022

(54) SEMICONDUCTOR MODULE

(71) Applicant: DENSO CORPORATION, Kariya (JP)

(72) Inventors: Shunsuke Arai, Kariya (JP); Shinji Hiramitsu, Kariya (JP); Takuo Nagase, Kariya (JP)

(73) Assignee: DENSO CORPORATION, Kariya (JP)

(*) Notice: Subject to any disclaimer, the term of this patent is extended or adjusted under 35 U.S.C. 154(b) by 121 days.

(21) Appl. No.: 16/731,244

(22) Filed: Dec. 31, 2019

(65) Prior Publication Data
US 2020/0135702 A1    Apr. 30, 2020

Related U.S. Application Data

(63) Continuation of application No. PCT/JP2018/024482, filed on Jun. 28, 2018.

(30) Foreign Application Priority Data

Jul. 27, 2017 (JP) .............................. JP2017-145786

(51) Int. Cl.
*H01L 25/07* (2006.01)
*H01L 23/00* (2006.01)
*H02M 7/537* (2006.01)

(52) U.S. Cl.
CPC ............ *H01L 25/072* (2013.01); *H01L 24/05* (2013.01); *H01L 24/45* (2013.01); *H02M 7/537* (2013.01); *H01L 2224/04042* (2013.01); *H01L 2924/13055* (2013.01); *H01L 2924/30107* (2013.01)

(58) Field of Classification Search
CPC ....... H01L 25/072; H01L 24/05; H01L 24/45; H01L 2224/04042; H01L 2924/13055; H01L 2924/30107
See application file for complete search history.

(56) References Cited

U.S. PATENT DOCUMENTS

| | | |
|---|---|---|
| 2009/0201708 A1 | 8/2009 | Ohkouchi et al. |
| 2014/0035112 A1* | 2/2014 | Kadoguchi ....... H01L 23/49562 257/666 |

(Continued)

FOREIGN PATENT DOCUMENTS

| | | |
|---|---|---|
| JP | H07-038013 A | 2/1995 |
| JP | H09-270491 A | 10/1997 |
| JP | 5207862 B2 | 6/2013 |

(Continued)

*Primary Examiner* — Marc Anthony Armand
(74) *Attorney, Agent, or Firm* — Posz Law Group, PLC

(57) ABSTRACT

In a semiconductor module, two switching elements are connected in parallel to each other. Each of the switching elements includes a first main electrode formed on one surface side, and a second main electrode and a gate electrode formed on a rear surface side opposite to the one surface side. A first conductor plate is coupled with two first main terminals at first coupling portions and is electrically connected with the first main electrodes. A second conductor plate is coupled with one second main terminal at a second coupling portion and is electrically connected with the second main electrodes. The second coupling portion is disposed between the switching elements in an alignment direction of the switching elements, and the first coupling portions are provided on both sides of the second coupling portion in the alignment direction.

14 Claims, 9 Drawing Sheets

(56) References Cited

U.S. PATENT DOCUMENTS

2016/0133597 A1\* 5/2016 Kouno .................... H01L 24/37
                       257/139
2017/0110395 A1    4/2017 Iwabuchi et al.

FOREIGN PATENT DOCUMENTS

| | | |
|---|---|---|
| JP | 2015-018943 A | 1/2015 |
| JP | 2018-067657 A | 4/2018 |
| JP | 2018-091809 A | 6/2018 |

\* cited by examiner

SEMICONDUCTOR MODULE

CROSS REFERENCE TO RELATED APPLICATIONS

The present application is a continuation application of International Patent Application No. PCT/JP2018/024482 filed on Jun. 28, 2018, which designated the U.S. and claims the benefit of priority from Japanese Patent Application No. 2017-145786 filed on Jul. 27, 2017. The entire disclosures of all of the above applications are incorporated herein by reference.

TECHNICAL FIELD

The present disclosure relates to a semiconductor module.

BACKGROUND

There has been known a semiconductor module including multiple switching elements connected in parallel to each other. Each of the switching elements has a gate electrode, and a first main electrode and a second main electrode through which a main current flows. The semiconductor module includes a first main terminal and a second main terminal serving as external connection terminals in addition to the switching elements.

SUMMARY

In a semiconductor module according to an aspect of the present disclosure, two switching elements are connected in parallel to each other. Each of the switching elements includes a first main electrode, a second main electrode, and a gate electrode. A first conductor plate is coupled with two first main terminals at first coupling portions and is electrically connected with the first main electrodes. A second conductor plate is coupled with one second main terminal at a second coupling portion and is electrically connected with the second main electrodes. The second coupling portion is disposed between the switching elements in an alignment direction of the switching elements, and the first coupling portions are provided on both sides of the second coupling portion in the alignment direction.

In a semiconductor module according to another aspect of the present disclosure, two switching elements are connected in parallel to each other. Each of the switching elements includes a first main electrode, a second main electrode, and a gate electrode. A first conductor plate is coupled with one first main terminal at a first coupling portion and is electrically connected with the first main electrodes. A second conductor plate is coupled with two second main terminals at second coupling portions and is electrically connected with the second main electrodes. The first coupling portion is disposed between the switching elements in an alignment direction of the switching elements, and the second coupling portions are provided on both sides of the first coupling portion in the alignment direction.

In a semiconductor module according to another aspect of the present disclosure, two switching elements are connected in parallel to each other. Each of the switching elements includes a gate electrode, and a first main electrode and a second main electrode through which a main current flows. A first conductor portion is coupled with a first main terminal at a first coupling portion and is electrically connected with the first main electrodes. A second conductor portion is coupled with a second main terminal at a second coupling portion and is electrically connected with the second main electrodes. The first coupling portion and the second conductor portion are disposed only between the switching elements in an alignment direction of the switching elements.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
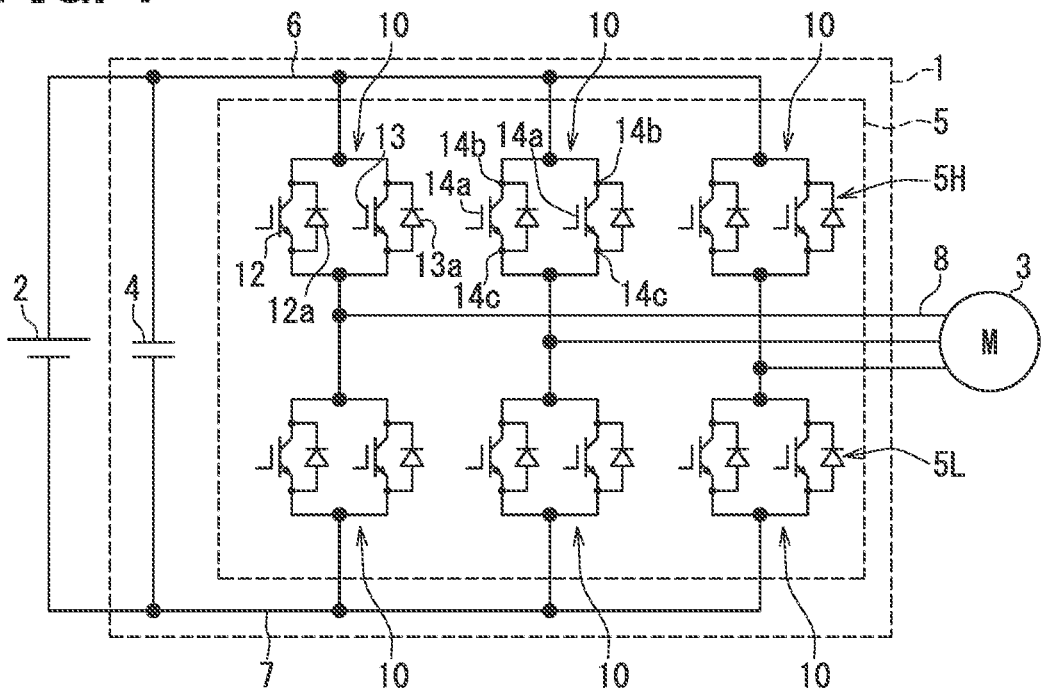
FIG. 1 is a diagram showing a schematic configuration of a power conversion device to which a semiconductor module according to a first embodiment is applied.

A semiconductor module according to a comparative example includes two switching elements. The two switching elements are driven simultaneously by one driver. Hereinafter, one of the two switching elements is referred to as a first switching element, and the other is referred to as a second switching element.

The semiconductor module includes one first main terminal and one second main terminal. The first main terminal and the second main terminal are arranged side by side along an alignment direction of the two switching elements. In the alignment direction described above, the first main terminal is arranged closer to the first switching element, and the second main terminal is arranged closer to the second switching element.

For that reason, between the first switching element and the second switching element, a difference occurs in a self-inductance of a current path provided between the second main electrode (for example, the emitter electrode) and the second main terminal (for example, the emitter terminal). Such a difference in self-inductance leads to a difference in parasitic inductance of the current path described above. When the parasitic inductance is different, a different voltage is induced in the parasitic inductance at a time of switching, so that a gate voltage is unbalanced between the first switching element and the second switching element. In other words, an imbalance (a deviation) occurs in the currents flowing through the two switching elements.

A semiconductor module according to an aspect of the present disclosure includes a plurality of switching elements each including a gate electrode, and a first main electrode and a second main electrode through which a main current flows, and connected in parallel with each other, a first main terminal and a second main terminal serving as external connection terminals, and a first current path formed between each of the first main electrodes and the first main terminal, and a second current path formed between each of the second main electrodes and the second main terminal, serving as current paths between the first main terminal and the second main terminal through each of the switching elements. When a self-inductance of an arbitrary current path, which is the second current path of any of the switching elements is denoted as Lsn, a mutual inductance of the arbitrary current path and other current paths except for the arbitrary current path is denoted as Mn, and a sum of Lsn and Mn is denoted as Ln, the switching elements and the current paths are disposed in such a manner that Ln of each of the switching elements is equal to each other.

As a result of intensive examination by the present inventors, it has been clarified that not only the difference in the self-inductance of the second current path but also the difference in the mutual inductance between the second current path and the other current paths is a factor of the difference in the parasitic inductance.

In the semiconductor module, the switching element and the current path are disposed in consideration of not only the self-inductance Lsn of the second current path but also the mutual inductance Mn between the second current path and other current paths by taking the advantages of the above knowledge. Therefore, the imbalance of the gate voltage and furthermore the current imbalance in the multiple switching elements at the time of switching can be restricted.

A semiconductor module according to another mode of the present disclosure includes two switching elements each including a first main electrode formed on one surface side, and a second main electrode and a gate electrode formed on a rear surface side opposite to the one surface side, disposed side by side in such a manner that the respective one surfaces are disposed on a same side, and connected in parallel to each other, two first main terminals and a second main terminal serving as external connection terminals, a first conductor plate to which the two first main terminals are coupled and both the first main electrodes of the two switching elements are electrically connected, and a second conductor plate to which the second main terminal is coupled and both the second main electrodes of the two switching elements are electrically connected. A second coupling portion, which is a coupling portion between the second main terminal and the second conductor plate, is disposed between the two switching elements in an alignment direction of the two switching elements. First coupling portions, which are coupling portions between the respective first main terminals and the first conductor plate, are provided on both sides of the second coupling portion in the alignment direction.

In the semiconductor module described above, since the two first main terminals are disposed so as to sandwich the second main terminal between the two first main terminals, the deviation of the arrangement of the main terminals can be restricted, and the imbalance of the sum of inductances can be reduced. This makes it possible to restrict the current imbalance of the multiple switching elements at the time of switching.

A semiconductor module according to another aspect of the present disclosure includes two switching elements each including a first main electrode formed on one surface side, and a second main electrode and a gate electrode formed on a rear surface side opposite to the one surface side, disposed side by side in such a manner that the respective one surfaces are disposed on a same side, and connected in parallel to each other, a first main terminal and two second main terminals serving as external connection terminals, and a first conductor plate to which the first main terminal is coupled and both the first main electrodes of the two switching elements are electrically connected, and a second conductor plate to which two of the second main terminals are coupled and both the second main electrodes of the two switching elements are electrically connected. A first coupling portion, which is a coupling portion between the first main terminal and the first conductor plate, is disposed between the two switching elements in an alignment direction of the two switching elements. Second coupling portions, which are coupling portions between the respective second main terminals and the second conductor plate, are provided on both sides of the first coupling portion in the alignment direction.

In the semiconductor module described above, since the two second main terminals are disposed so as to sandwich the first main terminal between the two second main terminals, the deviation of the arrangement of the main terminals can be restricted, and the imbalance of the sum of inductances can be reduced. This makes it possible to restrict the current imbalance of the multiple switching elements at the time of switching.

A semiconductor module according to another aspect of the present disclosure includes two switching elements including a gate electrode, and a first main electrode and a second main electrode through which a main current flows, a first main terminal and a second main terminal serving as external connection terminals, a first conductor portion to which the first main terminal is coupled and both the first main electrodes of the two switching elements are electrically connected, and a second conductor portion to which the second main terminal is coupled and both the second main electrodes of the two switching elements are electrically connected. A first coupling portion, which is a coupling portion between the first main terminal and the first conductor portion, and a second coupling portion, which is a coupling portion between the second main terminal and the second conductor portion, are disposed between the two switching elements in an alignment direction of the two switching elements.

In the semiconductor module, since the first coupling portion and the second coupling portion are respectively provided between the two switching elements in the alignment direction of the two switching elements, the deviation of the arrangement of the main terminals can be restricted, and the imbalance of the sum of inductances can be reduced, as compared with a configuration in which the first main terminal and the second main terminal are provided one by one, and at least one of the first coupling portion and the second coupling portion is provided outside a portion between the two switching elements. This makes it possible to restrict the current imbalance of the multiple switching elements at the time of switching while reducing the number of main terminals.

Multiple embodiments will be described with reference to the drawings. In the multiple embodiments, functionally and/or structurally corresponding parts are given the same reference numerals. Hereinafter, a thickness direction of switching elements is indicated by a Z-direction, and an alignment direction of the two switching elements, which is orthogonal to the Z-direction, is indicated by an X-direction. A direction orthogonal to both the Z-direction and the X-direction is denoted as a Y-direction. Unless otherwise specified, a shape along an XY plane defined by the X-direction and the Y-direction is a planar shape.

First Embodiment

First, a power conversion device to which a semiconductor module is applied will be described with reference to FIG. 1.

A power conversion device 1 shown in FIG. 1 is mounted on, for example, an electric vehicle or a hybrid vehicle. The power conversion device 1 is configured to convert a DC voltage applied from a DC power supply 2 installed in a vehicle into three-phase AC, and output the three-phase AC to a motor 3 of the three-phase AC system. The motor 3 functions as a travel driving source of the vehicle. The power conversion device 1 can also convert an electric power generated by the motor 3 into a direct current and charge the DC power supply 2. In this manner, the power conversion device 1 is capable of performing a bidirectional power conversion.

The power conversion device 1 includes a smoothing capacitor 4 and an inverter 5. A positive terminal of the smoothing capacitor 4 is connected to a positive electrode, which is a high potential side electrode of the DC power supply 2, and a negative terminal is connected to a negative electrode, which is a low potential side electrode of the DC power supply 2. The inverter 5 converts the input DC power into a three-phase AC with a predetermined frequency, and output the three-phase AC to the motor 3. The inverter 5 converts the AC power generated by the motor 3 into a DC power.

The inverter 5 includes six arms. Each arm is configured by a semiconductor module 10. In other words, the six semiconductor modules 10 configure the inverter 5. Among the six arms, three arms are upper arms 5H and the remaining three arms are lower arms 5L. Each upper arm 5H and a corresponding lower arm 5L are connected in series to each other to configure upper and lower arms for one phase. A connection point between each upper arm 5H and the corresponding lower arm 5L is connected to an output line 8 to the motor 3. The upper and lower arms for three phases configure the inverter 5.

In the present embodiment, an insulated gate bipolar transistor (hereinafter referred to as an IGBT) is employed as the switching element configuring the inverters 5. The semiconductor module 10 includes two IGBTs 12 and 13 connected in parallel to each other. Freewheel diodes 12a and 12a are connected in anti-parallel to the IGBTs 12 and 13, respectively. Reference numeral 14a shown in FIG. 1 denotes gate electrodes of the IGBTs 12 and 13. As described above, the switching element has the gate electrode 14a. The two IGBTs 12 and 13 connected in parallel are driven simultaneously by one driver. In other words, the gate electrodes 14a of the two IGBTs 12 and 13 are electrically connected to the same driver.

In addition, the IGBTs 12 and 13 are of an n-channel type. In the upper arm 5H, collector electrodes 14b of the IGBTs 12 and 13 are electrically connected to a high potential power supply line 6. In the lower arm 5L, emitter electrodes 14c of the IGBTs 12 and 13 are electrically connected to a low potential power supply line 7. Emitter electrodes 14c of the IGBTs 12 and 13 in the upper arm 5H and collector electrodes 14b of the IGBTs 12 and 13 in the lower arm 5L are connected to each other.

The power conversion device 1 includes, in addition to the inverter 5, a boost converter for boosting a DC voltage supplied from the DC power supply 2, a gate driver circuit for controlling the operation of the switching element configuring the inverter 5 and the boost converter, and so on.

Next, a schematic configuration of the semiconductor module 10 will be described with reference to FIGS. 2 to 5.

As shown in FIGS. 2 to 5, the semiconductor module 10 includes a sealing resin body 11, the IGBTs 12 and 13, a first heat sink 15, a terminal 17, a second heat sink 19, first main terminals 21, a second main terminal 22, and signal terminals 23.

Figure 2:
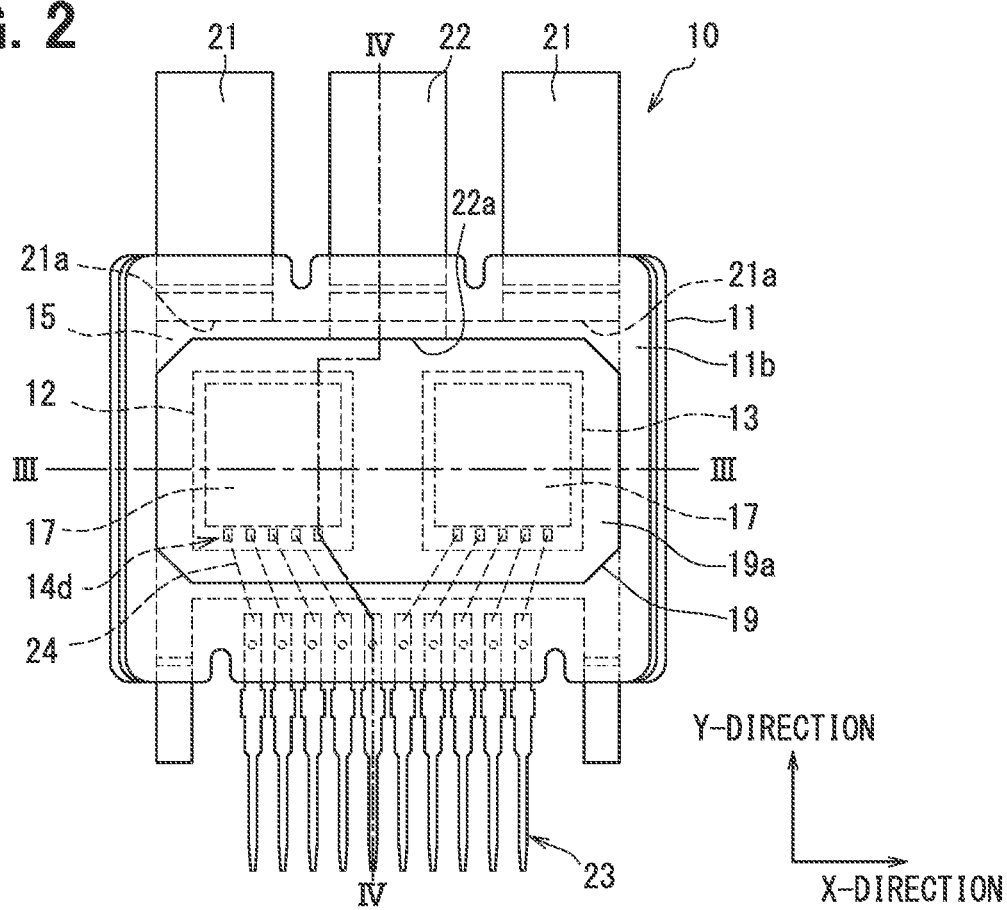
FIG. 2 is a plan view showing the semiconductor module according to the first embodiment.
Figure 3:
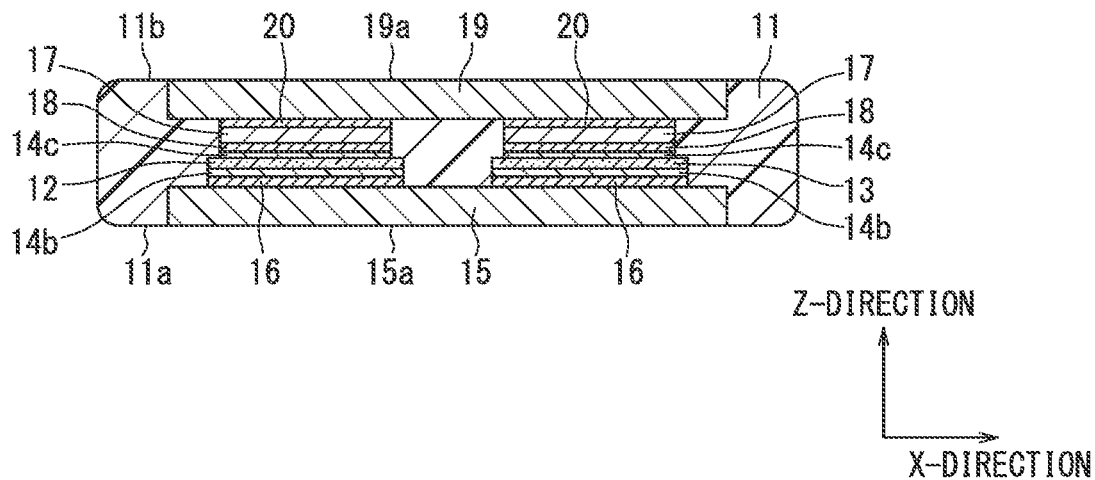
FIG. 3 is a cross-sectional view taken along a line III-III of FIG. 2.
Figure 4:
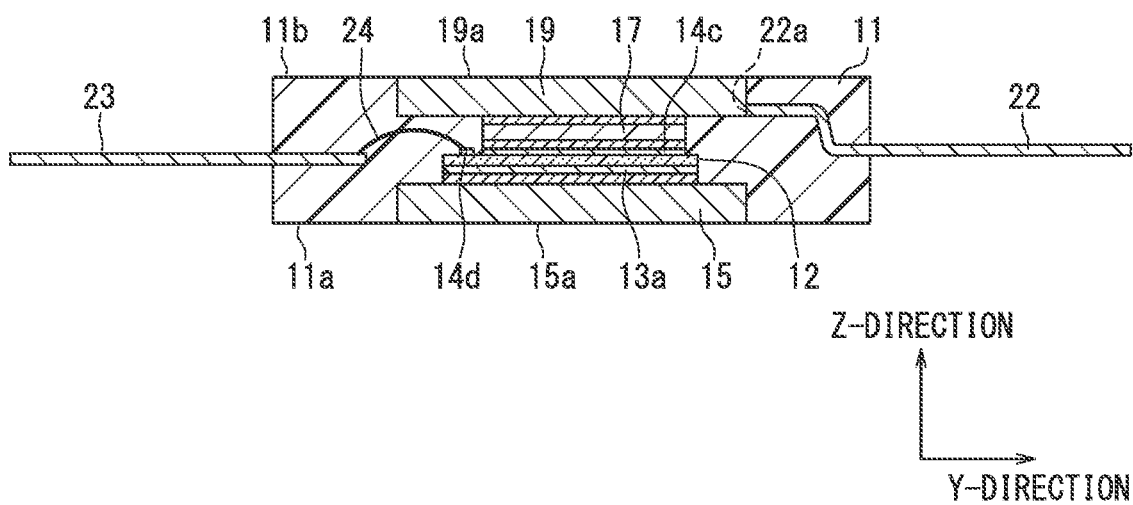
FIG. 4 is a cross-sectional view taken along a line IV-IV of FIG. 2.

The sealing resin body 11 is made of, for example, an epoxy resin. The sealing resin body 11 is molded by, for example, a transfer molding method. As shown in FIGS. 2 to 4, the sealing resin body 11 has one surface 11a orthogonal to the Z-direction, a rear surface 11b opposite to the one surface 11a, and a side surface connecting the one surface 11a and the rear surface 11b. The one surface 11a and the rear surface 11b are flat surfaces, for example.

The IGBTs 12 and 13 as semiconductor devices are formed on a semiconductor substrate (semiconductor chip) made of silicon and silicon carbide. The IGBTs 12 and 13 correspond to switching elements connected in parallel to each other. The IGBT 12 corresponds to a first switching element, and the IGBT 13 corresponds to a second switching element. The IGBTs 12 and 13 has a meaning as an element configuring a circuit and a meaning as a chip.

In the present embodiment, as described above, both the IGBTs 12 and 13 are of the n-channel type. The freewheel diodes 12a and 12a described above are also integrally formed in the IGBTs 12 and 13. More specifically, the diode 12b is formed in the IGBT 12, and the diode 12a is formed in the IGBT 13. In this way, reverse conduction (RC)-IGBT is employed as the IGBTs 12 and 13.

The IGBTs 12 and 13 has a vertical structure so that a current flows in the Z-direction. Although illustration is omitted, the gate electrode 14a described above is also formed in each of the IGBTs 12 and 13. The gate electrode 14a has a trench structure. As shown in FIG. 3, collector electrodes 14b are respectively formed on one surfaces of the IGBTs 12 and 13 in a plate thickness direction of the elements of the IGBTs 12 and 13, that is, in the Z-direction, and emitter electrodes 14c are respectively formed on rear surfaces opposite to the one surfaces. The collector electrode 14b also serves as cathode electrodes of the diodes 12a and 12a, and the emitter electrodes 14c also serve as anode electrodes of the diodes 12a and 12a. The collector electrode 14b corresponds to a first main electrode, and the emitter electrode 14c corresponds to a second main electrode.

The IGBTs 12 and 13 have substantially the same planar shape, specifically, a substantially rectangular planar shape, and have substantially the same size and substantially the same thickness as each other. The IGBTs 12 and 13 have the same configuration as each other. The IGBTs 12 and 13 are disposed such that the collector electrodes 14b are on the same side in the Z-direction and the emitter electrodes 14c are on the same side in the Z-direction. The IGBTs 12 and 13 are positioned at substantially the same height in the Z-direction and are disposed horizontally in the X-direction. The arrangement of the IGBTs 12 and 13 will be described in detail later.

As shown in FIGS. 2 and 4, pads 14d, which are electrodes for signals, are also formed on the rear surface of the IGBTs 12 and 13, that is, the surface on which emitter electrodes are formed. The pads 14d are formed at positions different from the emitter electrodes 14c. The pads 14d are electrically isolated from the emitter electrodes 14c. The pads 14d are formed at an end portion on the opposite side of a formation region of the emitter electrodes 14c in the Y-direction.

In the present embodiment, each of the IGBTs 12 and 13 has five pads 14d. Specifically, the five pads 14d are provided for a gate electrode, a Kelvin emitter for detecting a potential of the emitter electrode 14c, a current sense, an anode potential of a temperature sensor (temperature sensitive diode) for detecting the temperature of the IGBTs 12 and 13, and a cathode potential. The five pads 14d are collectively formed at one end side in the Y-direction and are aligned in the X-direction in the IGBT 12 having a substantially rectangular planar shape.

The first heat sink 15 functions to dissipate a heat of the IGBTs 12 and 13 to the outside of the semiconductor module 10, and also serves as a wiring. For that reason, in order to secure thermal conductivity and electrical conductivity, at least a metal material is used. The first heat sink 15 is also referred to as a heat radiation plate. The first heat sink 15 corresponds to a first conductor plate. In the present embodiment, the first heat sink 15 is provided so as to contain the IGBTs 12 and 13 in a projection view from the Z-direction. The first heat sink 15 is disposed closer to one surface 11a of the sealing resin body 11 than the IGBTs 12 and 13 in the Z-direction. The first heat sink 15 has a substantially rectangular planar shape with the X-direction as a longitudinal direction. The thickness of the first heat sink 15 is kept substantially constant, and a plate thickness direction of the first heat sink 15 is substantially parallel to the Z-direction.

The collector electrodes 14b of the IGBTs 12 and 13 are individually connected to the same surface of the first heat sink 15 through solder 16. Most of the first heat sink 15 is covered with the sealing resin body 11. Among the surfaces of the first heat sinks 15, a heat radiation surface 15a, which is a surface opposite to the IGBTs 12 and 13, is exposed from the sealing resin body 11. The heat radiation surface 15a is substantially flush with one side 11a. A portion of the surface of the first heat sink 15 excluding the connection portion with the solder 16 and the heat radiation surface 15a is covered with the sealing resin body 11.

The terminals 17 are respectively interposed between the IGBT 12 and the second heat sink 19, and between the IGBT 13 and the second heat sink 19. The terminals 17 are provided for the respective IGBTs 12 and 13. The terminals 17 are made of at least metal material in order to secure thermal conductivity and electrical conductivity because the terminals 17 are located on the thermal and electric conduction path between the IGBTs 12 and 13 and the second heat sink 19. The terminals 17 are disposed to face the emitter electrodes 14c of the corresponding IGBTs 12 and 13, and are electrically connected to the emitter electrodes 14c through solders 18.

Like the first heat sink 15, the second heat sink 19 also functions to dissipate the heat of the IGBTs 12 and 13 to the outside of the semiconductor module 10, and also functions as a wiring. The second heat sink 19 is also referred to as a heat radiation plate. The second heat sink 19 corresponds to a second conductor plate. In the present embodiment, the second heat sink 19 is also provided so as to enclose the IGBTs 12 and 13 in a projection view from the Z-direction. The second heat sink 19 is disposed on the rear surface 11b of the sealing resin body 11 with respect to the IGBTs 12 and 13 in the Z-direction. The second heat sink 19 also has a substantially rectangular planar shape with the X-direction as a longitudinal direction. Four corners of the rectangular are notched. The second heat sink 19 substantially corresponds with the first heat sink 15 in a projection view from the Z-direction. A thickness of the second heat sink 19 is also kept substantially constant, and the plate thickness direction of the second heat sink 19 is substantially parallel to the Z-direction.

The emitter electrodes 14c of the IGBTs 12 and 13 are individually electrically connected to the same surface of the second heat sink 19 through a solder 20. Specifically, the emitter electrode 14c and the second heat sink 19 are electrically connected to each other through the solder 18, the terminal 17, and the solder 20. Most of the second heat sink 19 is covered with the sealing resin body 11. Among the surfaces of the second heat sinks 19, a heat radiation surface 19a, which is a surface opposite to the IGBTs 12 and 13, is exposed from the sealing resin body 11. The heat radiation surface 19a is substantially flush with the rear surface 11b. A portion of the surface of the second heat sink 19 excluding a connection portion with the solder 20 and the heat radiation surface 19a is covered with the sealing resin body 11.

The first main terminals 21 and the second main terminal 22 are main terminals through which a main current flows, among the external connection terminals for electrically connecting the semiconductor module 10 and an external device. The first main terminals 21 are electrically connected to the collector electrodes 14b of the IGBTs 12 and 13. For that reason, the first main terminals 21 are also referred to as collector terminals. The first main terminals 21 are coupled to the first heat sink 15 and extend from the first heat sink 15 in the Y-direction. The first main terminals 21 are electrically connected to the collector electrodes 14b through the first heat sink 15 and the solder 16.

As shown in FIG. 2 and the like, in the present embodiment, the semiconductor module 10 includes two first main terminals 21. The same metal plate is processed so that the first main terminals 21 are provided integrally with the first heat sink 15. Reference numeral 21a shown in FIG. 2 denotes a first coupling portion at which the first main terminals 21 are coupled to the first heat sink 15. One end of the first main terminals 21 serves as a first coupling portion 21a.

Figure 5:
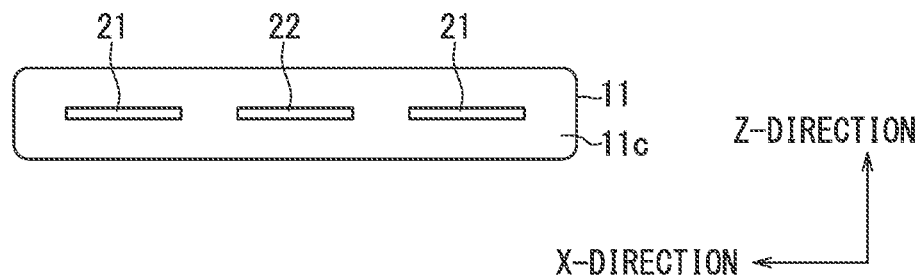
FIG. 5 is a plan view seen from a main terminal side.

The first main terminals 21 have a thickness smaller than that of the first heat sink 15, and are coupled to a surface of the first heat sink 15 opposite to the heat radiation surface 15a so as to be substantially flush with each other. Each of the first main terminals 21 has a bent portion in the sealing resin body 11. As shown in FIG. 5, the first main terminals 21 protrude to the outside from the vicinity of the center of the side surface 11c of the sealing resin body 11 in the Z-direction. Details of the arrangement of the first main terminals 21 will be described later.

The second main terminal 22 is electrically connected to the emitter electrodes 14c of the IGBTs 12 and 13. For that reason, the second main terminal 22 is also referred to as an emitter terminal. The second main terminal 22 is coupled to the second heat sink 19, and extends from the second heat sink 19 in the Y-direction in the same direction as the first main terminals 21. The second main terminal 22 is electrically connected to the emitter electrodes 14c through the second heat sink 19, the solder 20, the terminal 17, and the solder 18.

As shown in FIG. 2 and the like, in the present embodiment, the semiconductor module 10 includes one second main terminal 22. The same metal plate is processed so that the second main terminal 22 is provided integrally with the second heat sink 19. Reference numeral 22a shown in FIGS. 2 and 4 denotes a second coupling portion at which the second main terminal 22 is coupled to the second heat sink 19. One end of the second main terminal 22 serves as a second coupling portion 22a.

As shown in FIG. 4, the second main terminal 22 has a thickness smaller than a thickness of the second heat sink 19, and is coupled to a surface of the second heat sink 19 opposite to the heat radiation surface 19a so as to be flush with each other. The second main terminal 22 has a bent portion in the sealing resin body 11. As shown in FIG. 5, the second main terminal 22 protrudes to the outside from the side surface 11c from which the first main terminal 21 protrudes. Like the first main terminal 21, the second main terminal 22 also protrudes to the outside from the vicinity of the center in the Z-direction. Details of the arrangement of the second main terminal 22 will be described later.

The signal terminals 23 are electrically connected to the corresponding pads 14d of the IGBTs 12 and 13 through bonding wires 24. In the present embodiment, aluminum-based bonding wire 24 are employed. The signal terminals 23 are connected to the bonding wire 24 inside the sealing resin body 11, and protrude to the outside from the side surface of the sealing resin body 11, more specifically, the surface opposite to the side surface 11c. The signal terminals 23 corresponding to the signal terminals IGBTs 12 and 13 extend in the Y-direction.

In the semiconductor module 10 configured as described above, the IGBTs 12 and 13, a part of the first heat sink 15, the terminal 17, a part of the second heat sink 19, a part of the first main terminal 21, a part of the second main terminal 22, and a part of the signal terminal 23 are integrally sealed by the sealing resin body 11. The IGBTs 12 and 13 are sealed by the sealing resin body 11. In other words, the elements configuring one arm are sealed. For that reason, the semiconductor module 10 is also referred to as a 1 in 1 package.

The heat radiation surface 15a of the first heat sink 15 is substantially flush with the one surface 11a of the sealing resin body 11. In addition, the heat radiation surface 19a of the second heat sink 19 is substantially flush with the rear surface 11b of the sealing resin body 11. In this manner, the semiconductor module 10 has a double-sided heat radiation structure in which the heat radiation surfaces 15a and 19a are both exposed from the sealing resin body 11. The semiconductor module 10 can be formed, for example, by cutting the first heat sink 15 and the second heat sink 19 together with the sealing resin body 11. The heat radiation surfaces 15a and 19a can also be formed by molding the sealing resin body 11 so as to be in contact with a cavity wall surface of a mold for molding the sealing resin body 11.

Next, with reference to FIGS. 5 to 7, a current path and the arrangement of the IGBTs 12 and 13, the first main terminal 21, and the second main terminal 22 in the semiconductor module 10 will be described. FIG. 7 is a view in which the sealing resin body 11 is omitted from FIG. 2.

Figure 6:
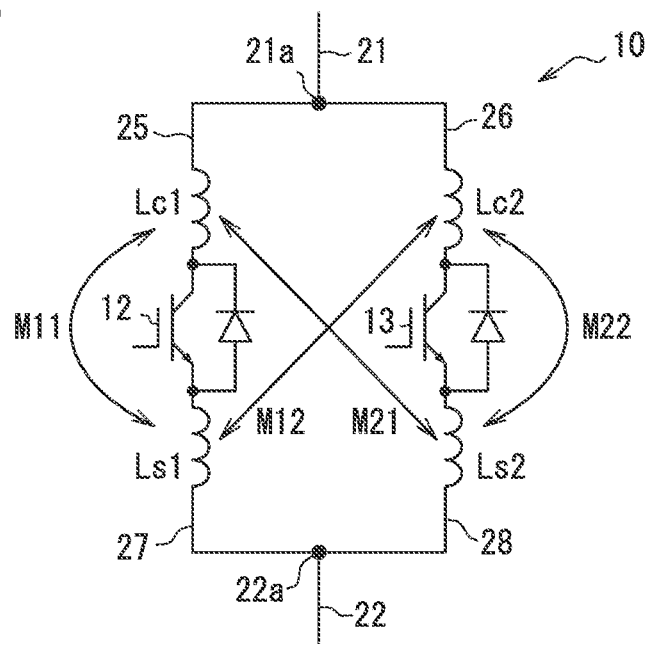
FIG. 6 is an equivalent circuit diagram in consideration of inductance.
Figure 7:
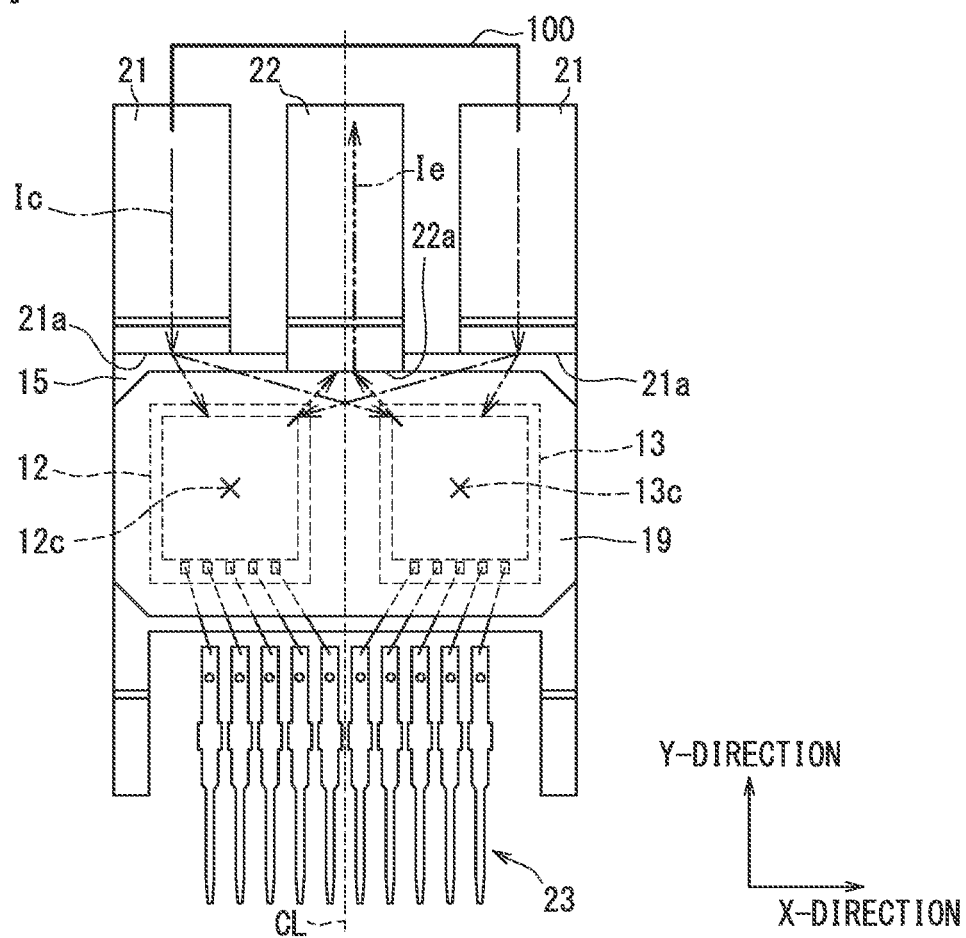
FIG. 7 is a plan view showing a positional relationship between IGBTs and main terminals.

FIG. 6 is an equivalent circuit diagram of the semiconductor module 10 in consideration of inductance. The current path through which the main current flows between the first main terminal 21 and the second main terminal 22 includes first current paths 25 and 26 and second current paths 27 and 28. The first current path 25 is provided between the first coupling portion 21a of the first main terminal 21 and the collector electrode 14b of the IGBT 12. The first current path 26 is provided between the first coupling portion 21a and the collector electrode 14b of the IGBT 13.

On the other hand, the second current path 27 is provided between the second coupling portion 22a of the second main terminal 22 and the emitter electrode 14c of the IGBT 12. The second current path 28 is provided between the second coupling portion 22a and the emitter electrode 14c of the IGBT 13. The first current paths 25 and 26 are collector current paths, and the second current paths 27 and 28 are emitter current paths.

In this example, self-inductances of the first current paths 25 and 26 are denoted as Lc1 and Lc2, and self-inductances of the second current paths 27 and 28 are denoted as Ls1 and Ls2. A mutual inductance between the first current path 25 and the second current path 27 is denoted by M11, a mutual inductance between the second current path 27 and the first current path 26 is denoted by M12, a mutual inductance between the second current path 28 and the first current path 25 is denoted by M21, and a mutual inductance between the first current path 26 and the second current path 28 is denoted by M22.

If a difference occurs in the self-inductances Ls1 and Ls2 of the second current paths 27 and 28 in the IGBTs 12 and 13 connected in parallel, the difference leads to a difference in the parasitic inductance of the second current paths 27 and 28. When the parasitic inductance is different, a different voltage is induced in the parasitic inductance at the time of switching, so that an emitter potential is different, and a gate voltage Vge of the IGBT 12 and a gate voltage Vge of the IGBT 13 are unbalanced. In other words, an imbalance (a deviation) occurs in the currents flowing through the two IGBTs 12 and 13.

Further, the present inventors have thoroughly studied through simulations and the like, and it has been revealed that not only the difference in the self-inductances Ls1 and Ls2 but also the difference in the mutual inductance between each of the second current paths 27 and 28 and the other current paths is a factor of the difference in the parasitic inductance, that is, a factor of the imbalance of the gate voltage Vge.

Therefore, in the present embodiment, in a configuration in which the multiple IGBTs are connected in parallel, when the self-inductance of an arbitrary current path which is the second current path in any of the IGBTs is denoted by Lsn, a mutual inductance of the arbitrary current path and other current paths except for the arbitrary current path is denoted as Mn, and the sum (inductance sum) of the self-inductance Lsn and the mutual inductance Mn is denoted as Ln, the multiple IGBTs and the multiple current paths are disposed so that the inductance sum Ln of each of the IGBTs becomes equal to each other. The mutual inductance Mn at the time of acting to weaken the self-inductance Lsn is assumed to be negative, and the mutual inductance Mn at the time of acting to strengthen the self-inductance Lsn is assumed to be positive.

Specifically, in the configuration in which the two IGBTs 12 and 13 are connected in parallel, the IGBTs 12 and 13 and the current paths (the first current paths 25 and 26 and the second current paths 27 and 28) are disposed so that an inductance sum L1 of the IGBT 12 and an inductance sum L2 of the IGBT 13 are equal to each other.

A mutual inductance M1 between the second current path 27 of the IGBT 12 and other current paths is the sum of the mutual inductances M11 and M12, that is, M1=M11+M12. A mutual inductance M2 between the second current path 28 of the IGBT 13 and other current paths is the sum of the mutual inductances M21 and M22, that is, M2=M21+M22. The inductance sum L1 of the IGBT 12 is the sum of the self-inductance Ls1 and the mutual inductance M1, that is, L1=Ls1+M1. The inductance sum L2 of the IGBT 13 is the sum of the self-inductance Ls2 and the mutual inductance M2, that is, L2=Ls2+M2. Therefore, when L1=L2 is met, the following relationship is satisfied.

$$Ls1+M11+M12=Ls2+M21+M22 \qquad \text{(Expression 1)}$$

In order to satisfy the relationship of L1=L2, that is, the relationship of Mathematical Expression 1, in the present embodiment, as shown in FIG. 7, the semiconductor module 10 includes, as the main terminals, two first main terminals 21 and one second main terminal 22 as described above. The second main terminal 22 is coupled to one end of the second heat sink 19 having a substantially rectangular planar shape in the Y-direction. The second coupling portion 22a of the second main terminal 22 is provided between a center 12c of the IGBT 12 and a center 13c of the IGBT 13 in the X-direction, which is the alignment direction of the IGBTs 12 and 13. The center of the second coupling portion 22a in a width direction of the second main terminal 22 is on a center line CL that passes through the center between the IGBTs 12 and 13 in the X-direction and is parallel to the Y-direction.

As described above, the configurations of the two IGBTs 12 and 13 are the same, and the connection structures of the respective IGBTs 12 and 13 and the first heat sink 15 and the second heat sink 19 are also the same. Therefore, the difference in the self-inductances Ls1 and Ls2 of the second current paths 27 and 28 is substantially determined according to a positional relationship between the respective emitter electrodes 14c and the second coupling portion 22a, in other words, a positional relationship between the IGBTs 12 and 13 and the second coupling portion 22a. In the present embodiment, as described above, since the center of the second coupling portion 22a is provided on the center line CL, the self-inductances Ls and Ls2 are substantially equal to each other.

The two first main terminals 21 are coupled to one end of the first heat sink 15 having a substantially rectangular planar shape in the Y-direction, more specifically, to an end portion on the same side as the end of the second heat sink 19 to which the second main terminal 22 is coupled. The first main terminals 21 are provided so as to sandwich the second main terminal 22 between the first main terminals 21 in the X-direction. As shown in FIG. 5, the first main terminal 21, the second main terminal 22, and the first main terminal 21 are disposed in the stated order in the X-direction orthogonal to the plate thickness direction. The two first coupling portions 21a are provided on both sides of the second coupling portion 22a in the X-direction.

The first main terminals 21 are coupled to the vicinity of both ends of the first heat sink 15 in the X-direction. As a result, in an XY-plane, the IGBTs 12 and 13, the two first main terminals 21, and the one second main terminal 22 are disposed symmetrically with respect to the center line CL. Therefore, the mutual inductances M1 and M2 are substantially equal to each other. The first heat sink 15 and the second heat sink 19 are also symmetrical with respect to the center line CL. In this way, in the semiconductor module 10, M1=M2 is realized in a case of Ls1=Ls2, whereby L1=L2 is satisfied.

As described above, according to the semiconductor module 10 of the present embodiment, the knowledge that the mutual inductance is also a factor of the current imbalance at the time of switching is utilized. Specifically, the IGBTs 12 and 13, and the first main terminal 21 and the second main terminal 22, which are the elements that determine the respective current paths 25, 26, 27, and 28, are disposed in consideration of not only the self-inductances Ls1 and Ls2 of the second current paths 27 and 28 but also the mutual inductances M1 and M2 between the second current paths 27 and 28 and the other current paths. Therefore, the imbalance of the gate voltage Vge of the IGBTs 12 and 13 at the time of switching and further a current imbalance can be effectively restricted.

Arrows in one-dot chain lines shown in FIG. 7 indicate a collector current Ic, and arrows in two-dot chain lines indicate an emitter current Ie. The direction of the arrow is a flow direction of current. Reference numeral 100 denotes a busbar 100 connecting the two first main terminals 21. With the arrangement described above, the collector current Ic and the emitter current Ie flow so as to be line-symmetrical with respect to a center line CL between the IGBTs 12 and 13. In this manner, the current imbalance can be effectively restricted.

In the present embodiment, the semiconductor module 10 includes the two first main terminals 21 and the one second main terminal 22, and the second coupling portion 22a of the second main terminal 22 is provided between the IGBT 12 and the IGBT 13 in the X-direction, which is the alignment direction of the IGBTs 12 and 13. The first coupling portions 21a are provided on both sides of the second coupling portion 22a in the X-direction.

Because the second main terminal 22 is disposed between the two first main terminals 21, as compared with a configuration in which the first main terminal and the second main terminal are provided one by one, and the first main terminal and the second main terminal are aligned in a direction orthogonal to the plate thickness direction, the deviation of the arrangement of the main terminals can be restricted, thereby being capable of reducing the imbalance of the sum of inductances L1 and L2. This makes it possible to restrict the current imbalance of the IGBTs 12 and 13 at the time of switching.

In the present embodiment, although the self-inductances Ls1 and Ls2 of the second current paths 27 and 28 satisfy the relationship of Ls1=Ls2, the present disclosure is not limited to this configuration.

Figure 8:
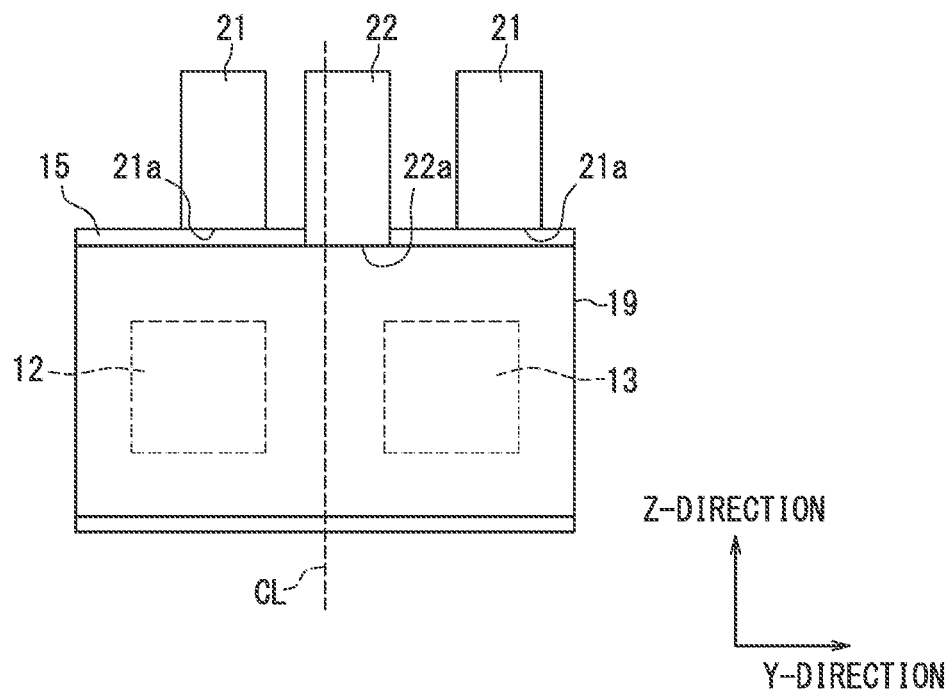
FIG. 8 is a plan view showing a first modification.

For example, the IGBTs 12 and 13, the first main terminal 21, and the second main terminal 22 may be disposed so that the inductance sums L1 and L2 satisfy the relationship of L1=L2 by setting the self-inductances Ls1 and Ls2 of the second current paths 27 and 28 to Ls1>Ls2 and setting the mutual inductances M1 and M2 to M1<M2. In a first modification shown in FIG. 8, the second main terminal 22 is disposed closer to the IGBT 13 with respect to the center line CL between the IGBTs 12 and 13, thereby satisfying Ls1>Ls2. The first main terminals 21 are disposed on both sides of the second main terminal 22 so as to satisfy M1<M2 to achieve the relationship of L1=L2.

Figure 9:
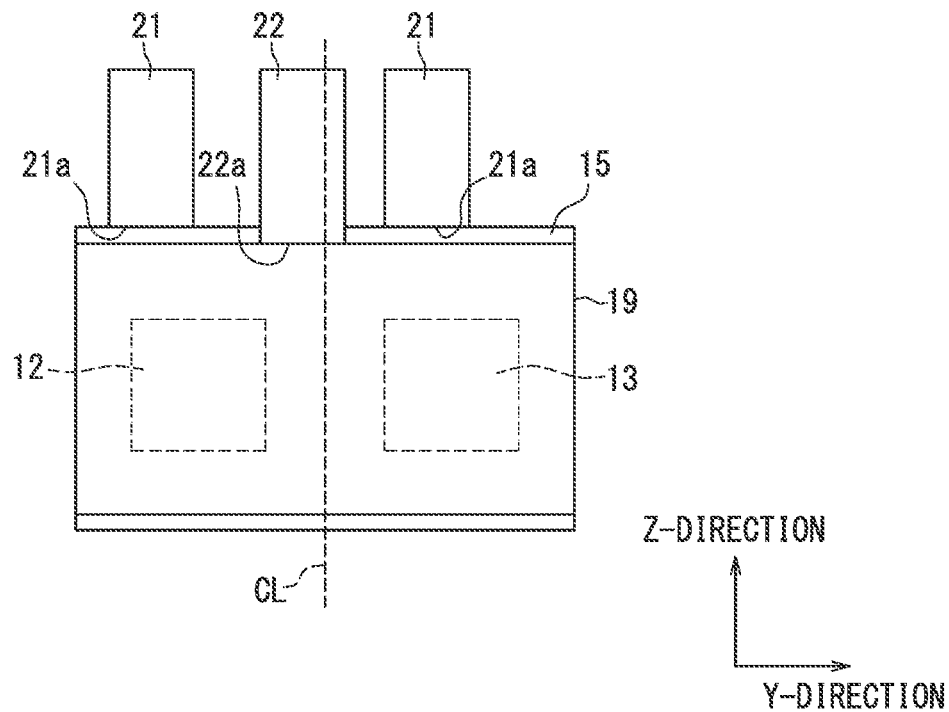
FIG. 9 is a plan view showing a second modification.

In addition, the IGBTs 12 and 13, the first main terminal 21, and the second main terminal 22 may be disposed so that the inductance sums L1 and L2 satisfy the relationship of L1=L2 by setting the self-inductances Ls1 and Ls2 of the second current paths 27 and 28 to Ls1<Ls2 and setting the mutual inductances M1 and M2 to M1>M2. In a second modification shown in FIG. 9, the second main terminal 22 is disposed closer to the IGBT 12 with respect to the center line CL between the IGBTs 12 and 13, thereby satisfying Ls1<Ls2. In addition, the first main terminals 21 are disposed on both sides of the second main terminal 22 so as to satisfy M1>M2 to achieve the relationship of L1=L2.

Second Embodiment

The present embodiment can refer to the preceding embodiment. For that reason, a description of portions common to the semiconductor module 10 described in the preceding embodiment will be omitted.

Figure 10:
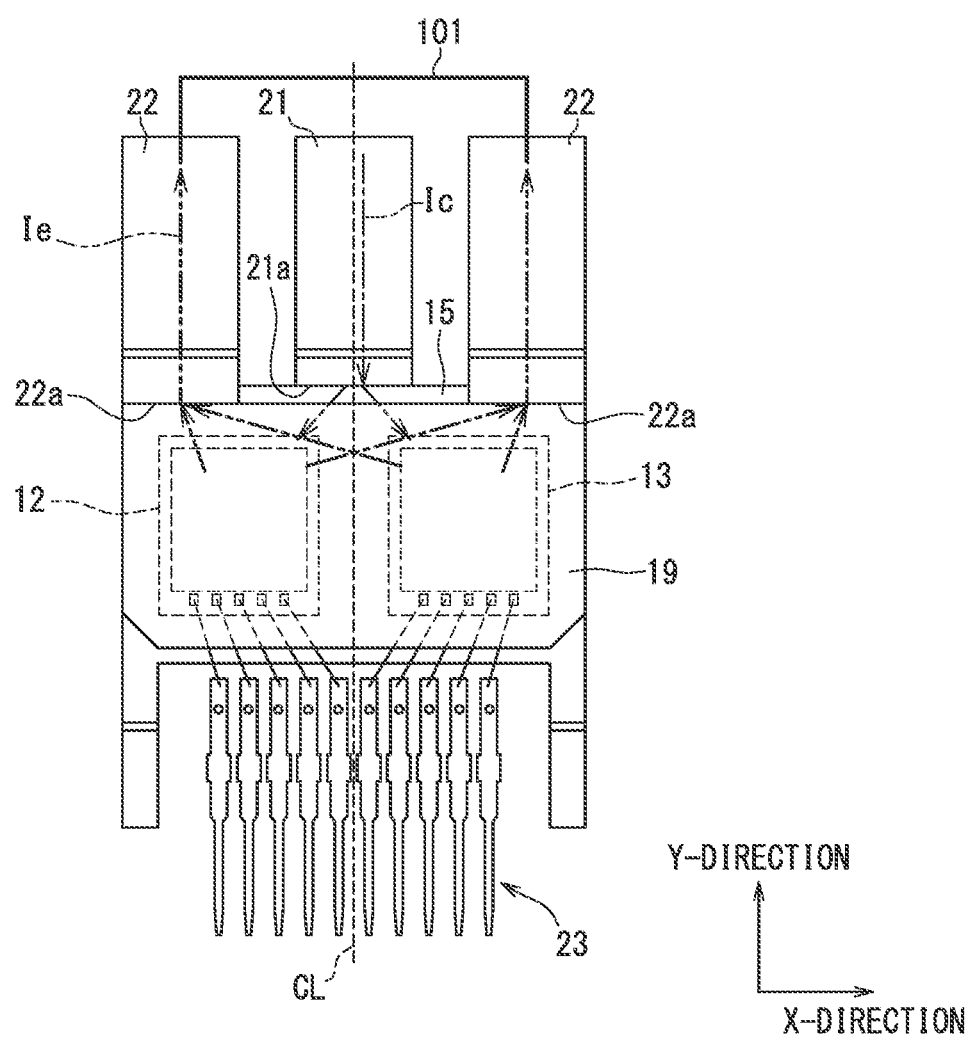
FIG. 10 is a plan view showing a positional relationship between IGBTs and main terminals in a semiconductor module according to a second embodiment.

As shown in FIG. 10, a semiconductor module 10 of the present embodiment includes one first main terminal 21 and two second main terminals 22 as main terminals. FIG. 10 corresponds to FIG. 7, and a sealing resin body 11 will be omitted from illustration. The configuration is substantially the same as that of the first embodiment (refer to FIG. 7) except that the number and coupling positions of the first main terminal 21 and the second main terminals 22 are different.

In FIG. 10, IGBTs 12 and 13, a first main terminal 21, and second main terminals 22 are disposed so as to satisfy a relationship of L1=L2 by Ls1=Ls2 and M1=M2. Specifically, the first main terminal 21 is provided between the IGBTs 12 and 13 in the X-direction so that a center of a first coupling portion 21a of the first main terminal 21 in a width direction is located on a center line CL. The second main terminals 22 are coupled to the vicinity of both ends of the second heat sink 19 in the X-direction. As a result, in an XY-plane, the arrangement of the IGBTs 12 and 13, one first main terminal 21, and two second main terminals 22 is line-symmetrical with respect to the center line CL.

In this manner, in the configuration including one first main terminal 21 and two second main terminals 22, M1=M2 is realized in a case of Ls1=Ls2, thereby satisfying L1=L2. Therefore, similarly to the preceding embodiment, the current imbalance of the IGBTs 12 and 13 at the time of switching can be effectively restricted.

Reference numeral 101 shown in FIG. 10 denotes a busbar connecting the two second main terminals 22. With the above arrangement, a collector current Ic and an emitter current Ie flow in a line-symmetrical manner with respect to the center line CL between the IGBTs 12 and 13. In this manner, the current imbalance can be effectively restricted.

In the present embodiment, the semiconductor module 10 includes one first main terminal 21 and two second main terminals 22, and the first coupling portion 21a of the first main terminal 21 is provided between the IGBT 12 and the IGBT 13 in the X-direction, which is the alignment direction of the IGBTs 12 and 13. The second coupling portions 22a are provided on both sides of the first coupling portion 21a in the X-direction.

Since the two second main terminals 22 are disposed so as to sandwich the first main terminal 21 between the second main terminals 22, the deviation of the arrangement of the main terminals can be restricted, thereby being capable of reducing the unbalance of the inductance sums L1 and L2, as compared with the configuration in which the first main terminal and the second main terminal are provided one by one, and the first main terminal and the second main terminal are disposed side by side in the direction orthogonal to the plate thickness direction. This makes it possible to restrict the current imbalance of the IGBTs 12 and 13 at the time of switching.

Also, in the present embodiment, the self-inductances Ls1 and Ls2 of the second current paths 27 and 28 are not limited to an example satisfying the relationship of Ls1=Ls2. In the configuration including one first main terminal 21 and two second main terminals 22 shown in the present embodiment, M1<M2 may be realized in a case of Ls1>Ls2, thereby satisfying the relationship of L1=L2. Also, M1>M2 may be realized in a case of Ls1<Ls2, thereby satisfying a relationship L1=L2.

Third Embodiment

The present embodiment can refer to the preceding embodiment. For that reason, a description of portions common to the semiconductor module 10 described in the preceding embodiment will be omitted.

Figure 11:
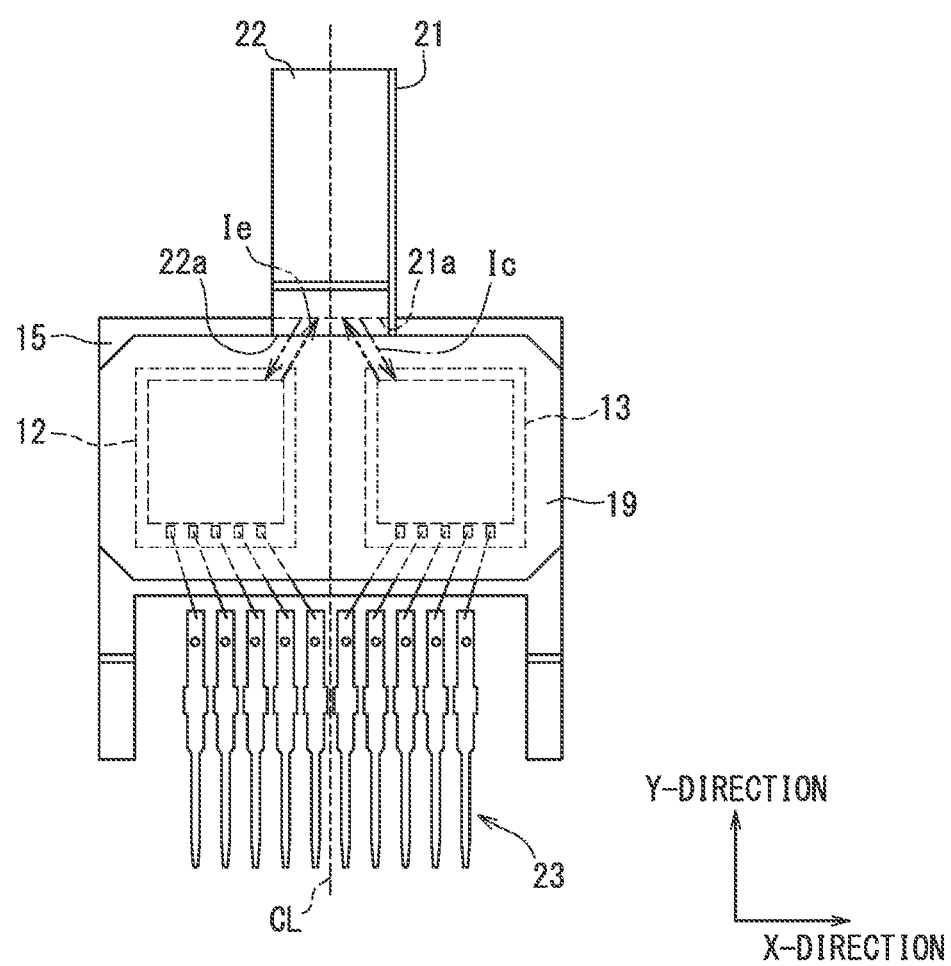
FIG. 11 is a plan view showing a positional relationship between IGBTs and main terminals in a semiconductor module according to a third embodiment, and corresponds to FIG. 7.

As shown in FIG. 11, a semiconductor module 10 according to the present embodiment has a first main terminal 21 and a second main terminal 22 one by one. FIG. 11 corresponds to FIG. 7, and a sealing resin body 11 will be omitted from illustration. In FIG. 11, for convenience of description, the first main terminal 21 is shown with a slight displacement. The configuration is substantially the same as that of the first embodiment (refer to FIG. 7) except that the number and coupling positions of the first main terminal 21 and the second main terminals 22 are different.

In FIG. 11, IGBTs 12 and 13, the first main terminal 21, and second main terminals 22 are disposed so as to satisfy a relationship of L1=L2 by Ls1=Ls2 and M1=M2. Specifically, the first main terminal 21 and the second main terminal 22 extend on the same side in the Y-direction. The first main terminal 21 and the second main terminal 22 are provided between IGBTs 12 and 13 in the X-direction so that a center of a first coupling portion 21a of the first main terminal 21 in the width direction and a center of a second coupling portion 22a of the second main terminal 22 in the width direction are both located on a center line CL. As a result, in an XY-plane, the arrangement of the IGBTs 12 and 13, one first main terminal 21, and one second main terminal 22 is line-symmetrical with respect to the center line CL.

In this manner, in the configuration including one first main terminal 21 and one second main terminal 22, M1=M2 is realized in a case of Ls1=Ls2, thereby satisfying L1=L2. Therefore, similarly to the preceding embodiment, the current imbalance of the IGBTs 12 and 13 at the time of switching can be restricted. In particular, the current imbalance of the IGBTs 12 and 13 can be effectively restricted while reducing the number of main terminals.

With the above arrangement, as shown in FIG. 11, a collector current Ic and an emitter current Ie flow so as to be line-symmetrical with respect to the center line CL between the IGBTs 12 and 13. In this manner, the current imbalance can be effectively restricted.

In the present embodiment, the semiconductor module 10 includes one first main terminal 21 and one second main terminal 22, and the first coupling portion 21a of the first main terminal 21 and the second coupling portion 22a of the second main terminal 22 are provided between the IGBT 12 and the IGBT 13 in the X-direction, which is the alignment direction of the IGBTs 12 and 13. A first heat sink 15 corresponds to a first conductor portion, and the second heat sink 19 corresponds to a second conductor portion.

Since the first coupling portion 21a and the second coupling portion 22a are both provided between the IGBT 12 and 13 in the X-direction, compared to a configuration in which one first main terminal and one second main terminal are provided, and at least one of the first coupling portion and the second coupling portion is provided outside the space between the two IGBTs, it is possible to restrict the deviation of the arrangement of the main terminals, thereby reducing the unbalance between the inductances L1 and L2. This makes it possible to restrict the current imbalance of the IGBTs 12 and 13 at the time of switching while reducing the number of main terminals.

It should be noted that the self-inductance Ls1 and Ls2 of the second current paths 27 and 28 is not limited to the case in which the self-inductance satisfies the relationship of Ls1=Ls2. In the configuration including one first main terminal 21 and one second main terminal 22 shown in the present embodiment, M1<M2 may be realized in a case of Ls1>Ls2, thereby satisfying the relationship L1=L2. Also, M1>M2 may be realized in a case of Ls1<Ls2, thereby satisfying a relationship L1=L2.

Though not mentioned in particular, in the case where the first main terminal 21 and the second main terminal 22 are disposed so as to overlap with each other more or less in a projection view in the Z-direction, an electrically insulating spacer disposed between the first main terminal 21 and the second main terminal 22 may be further provided. The spacer is in close contact with a side surface 11c of the sealing resin body 11. The spacer can restrict a resin from leaking from a space between the first main terminal 21 and the second main terminal 22 at the time of molding the sealing resin body 11. Incidentally, with removal of the spacer after molding, the semiconductor module 10 can be configured not to include the spacer.

Figure 12:
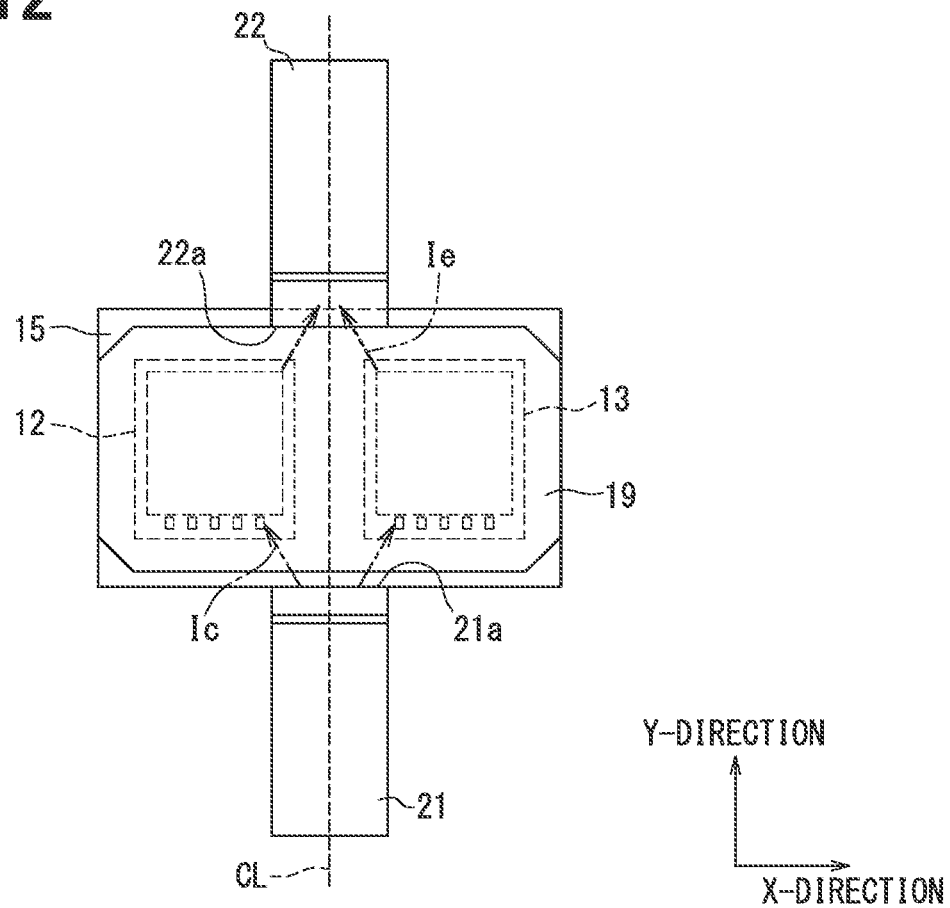
FIG. 12 is a plan view showing a third modification.

The configuration in which the first coupling portion 21a and the second coupling portion 22a are provided between the IGBTs 12 and 13 in the X-direction is not limited to the example described above. For example, as in a third modification shown in FIG. 12, the first main terminal 21 and the second main terminal 22 may extend on opposite sides in the Y-direction. In particular, in FIG. 12, as in FIG. 11, the center of the first coupling portion 21a in the width direction and the center of the second coupling portion 22a in the width direction are both located on the center line CL. For that reason, the current imbalance of the IGBTs 12 and 13 can be more effectively restricted. In FIG. 12, a signal terminal 23 and a bonding wire 24 are omitted for convenience.

Fourth Embodiment

The present embodiment can refer to the preceding embodiment. For that reason, a description of portions common to the semiconductor module 10 described in the preceding embodiment will be omitted.

In the third embodiment, the first main terminal 21 and the second main terminal 22 are provided one by one, and the first coupling portion 21a and the second coupling portion 22a are both provided between the IGBTs 12 and 13 in the X-direction in the double-sided heat radiation structure. Conversely, in the present embodiment, as shown in FIG. 13, in a one-sided heat radiation structure, a first main terminal 21 and a second main terminal 22 are provided one by one, and a first coupling portion 21a and a second coupling portion 22a are both provided between IGBTs 12 and 13 in the X-direction.

Figure 13:
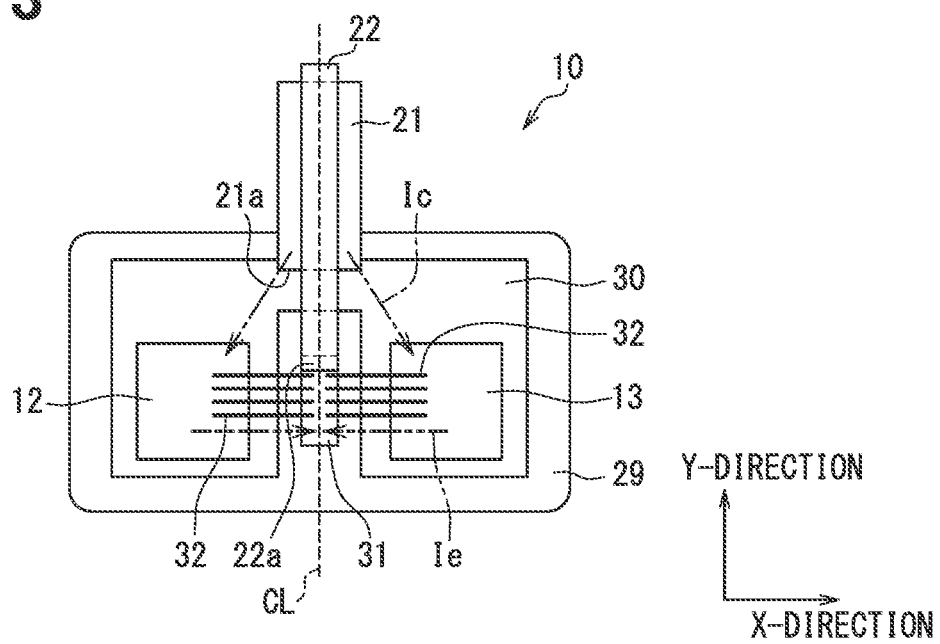
FIG. 13 is a plan view showing a semiconductor module according to a fourth embodiment.

A semiconductor module 10 shown in FIG. 13 includes an insulating plate 29, conductor layers 30 and 31, and a bonding wire 32 in addition to the two IGBTs 12 and 13, the first main terminal 21, and the second main terminal 22. The insulating plate 29 is made of an electrically insulating material such as ceramics. The conductor layers 30 and 31 made of a metal material such as copper are provided on one surface of the insulating plate 29. The conductor layers 30 and 31 are provided on the same surface and are electrically separated from each other.

IGBTs 12 and 13 are mounted on the conductor layer 30. The IGBTs 12 and 13 are disposed such that collector electrode forming surfaces face the conductor layer 30, and a collector electrode 14b (not shown) and the conductor layer 30 are electrically connected to each other through solder or the like. The IGBTs 12 and 13 are disposed side by side in the X-direction.

The first main terminal 21 is connected to the conductor layer 30. For example, the first main terminal 21 is connected to the conductor layer 30 through solder (not shown). A connection portion with the conductor layer 30 serves as a first coupling portion 21a of the first main terminal 21. The first coupling portion 21a is provided between the center of the IGBT 12 and the center of the IGBT 13 in the X-direction. The conductor layer 30 corresponds to a first conductor portion.

Emitter electrodes 14c (not shown) of the IGBTs 12 and 13 are electrically connected to the conductor layer 31 through bonding wires 32. The conductor layer 31 and the bonding wires 32 correspond to a second conductor portion. The second main terminal 22 is connected to the conductor layer 31. For example, the second main terminal 22 is connected to the conductor layer 31 through solder (not shown). The connection portion with the conductor layer 31 serves as a second coupling portion 22a of the second main terminal 22. The second coupling portion 22a is also provided between the center of the IGBT 12 and the center of the IGBT 13 in the X-direction.

As described above, in the present embodiment, since the first coupling portion 21a and the second coupling portion 22a are both provided between the IGBT 12 and 13 in the X-direction, compared to a configuration in which one first main terminal and one second main terminal are provided, and at least one of the first coupling portion and the second coupling portion is provided outside the space between the two IGBTs, it is possible to restrict the deviation of the arrangement of the main terminals, thereby reducing the unbalance between the inductances L1 and L2. This makes it possible to restrict the current imbalance of the IGBTs 12 and 13 at the time of switching while reducing the number of main terminals.

Further, in the present embodiment, the conductor layer 30 is substantially U-shaped in a plane. The conductor layer 30 has one bent portion of 180 degrees. Then, the IGBT 12 is attached to one end side of the conductor layer 30, and the IGBT 13 is attached to the other end side. The first main terminal 21 is coupled to the vicinity of the center of the conductor layer 30 so that the center of the first coupling portion 21a in the width direction is located on the center line CL. The first main terminal 21 extends in the Y-direction. The conductor layer 31 is disposed between opposing regions of the conductor layer 30. The conductor layers 31 are disposed between the IGBTs 12 and 13. The conductor layer 31 is provided on the center line CL. The second main terminal 22 is coupled to the conductor layer 31 so that the center of the second coupling portion 22a in the width direction is located on the center line CL. The second main terminal 22 has a bent portion, and is disposed so as to overlap with the first main terminal 21 in a projection view in the Z-direction.

As a result, in an XY-plane, the arrangement of the IGBTs 12 and 13, one first main terminal 21, and one second main terminal 22 is line-symmetrical with respect to the center line CL. In this manner, in the configuration including one first main terminal 21 and one second main terminal 22, M1=M2 is realized in a case of Ls1=Ls2, thereby satisfying L1=L2. Therefore, similarly to the preceding embodiments, the current imbalance of the IGBTs 12 and 13 at the time of switching can be effectively restricted.

With the above arrangement, as shown in FIG. 13, a collector current Ic and an emitter current Ie flow so as to be line-symmetrical with respect to the center line CL between the IGBTs 12 and 13. In this manner, the current imbalance can be effectively restricted.

It should be noted that the self-inductance Ls1 and Ls2 of the second current paths 27 and 28 is not limited to the case in which the self-inductance satisfies the relationship of Ls1=Ls2. In the configuration including one first main terminal 21 and one second main terminal 22 shown in the present embodiment, M1<M2 may be realized in a case of Ls1>Ls2, thereby satisfying the relationship L1=L2. Also, M1>M2 may be realized in a case of Ls1<Ls2, thereby satisfying a relationship L1=L2.

Figure 14:
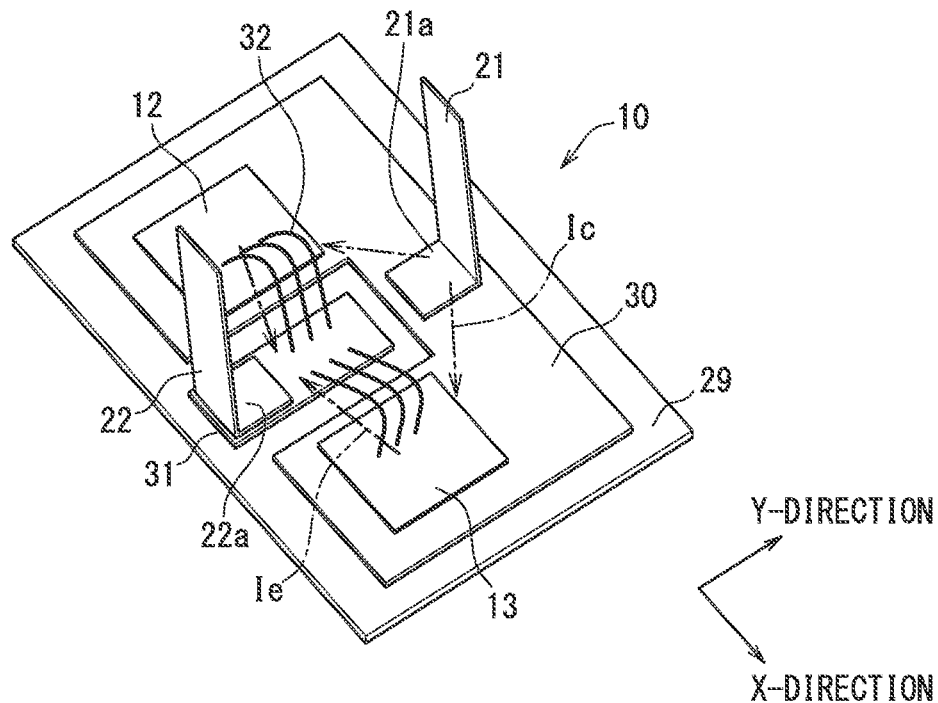
FIG. 14 is a plan view showing a fourth modification.

In the one-sided heat radiation structure, a configuration in which the first main terminal 21 and the second main terminal 22 are provided one by one, and the first coupling portion 21a and the second coupling portion 22a are provided between the IGBTs 12 and 13 is not limited to the above examples. For example, as in the fourth modification shown in FIG. 14, the first main terminal 21 and the second main terminal 22 may have a structure extending in the Z-direction. In FIG. 14, each of the first main terminal 21 and the second main terminal 22 has an L-shape with a bent portion of approximately 90 degrees. The other configuration is the same as that of FIG. 13. Even in such a configuration, the collector current Ic and the emitter current Ie flow so as to be line-symmetrical with respect to the center line CL (not shown) between the IGBTs 12 and 13. Therefore, the current imbalance can be effectively restricted.

Figure 15:
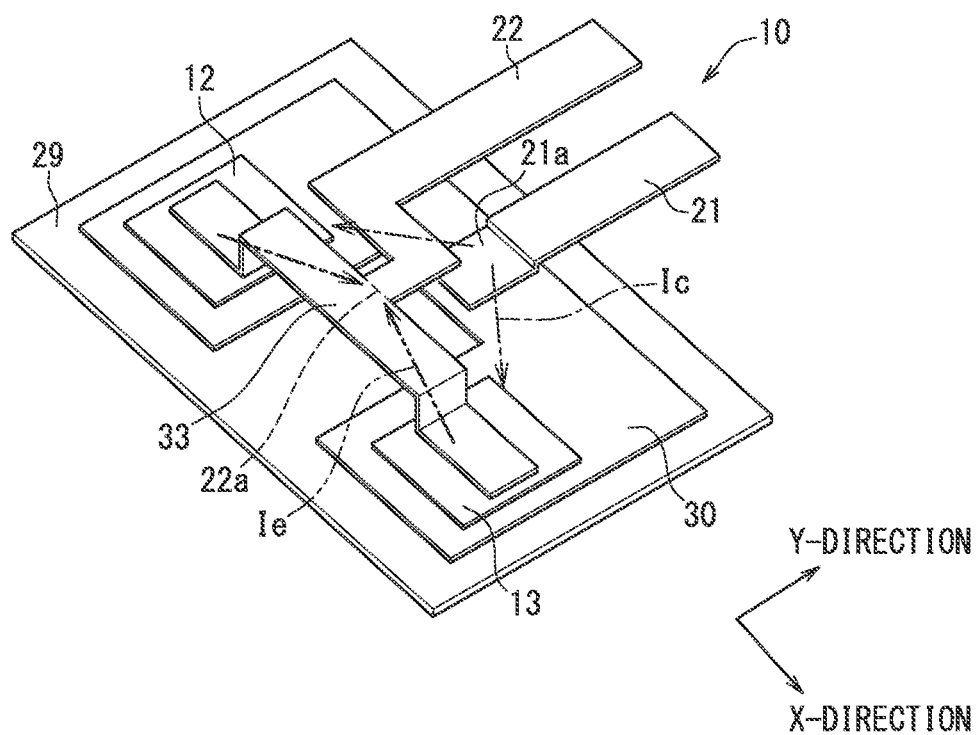
FIG. 15 is a plan view showing a fifth modification.

In a fifth modification shown in FIG. 15, a metal lead 33 is used instead of the conductor layer 31 and the bonding wire 32. The lead 33 corresponds to a second conductor portion. The lead 33 extends in the X-direction. The lead 33 has two bent portions, and bridges emitter electrodes 14c (not shown) of the IGBTs 12 and 13. The second main terminal 22 is coupled to the lead 33. The second main terminal 22 and the lead 33 are integrated together by processing the same metal plate. The second main terminal 22 has a planar L-shape. As a result, the second coupling portion 22a is provided on the center line CL (not shown) and does not overlap with the first main terminal 21 in a projection view in the Z-direction. Even in such a configuration, the collector current Ic and the emitter current Ie flow so as to be line-symmetrical with respect to the center line CL (not shown) between the IGBTs 12 and 13. Therefore, the current imbalance can be effectively restricted.

The semiconductor module 10 may further include a heat radiation member such as a heat sink or a sealing resin body. The heat radiation member is connected to a surface of the insulating plate 29 opposite to the conductor layers 30 and 31. The sealing resin body seals the IGBT 12, the sealing resin body 13, and the like.

The disclosure in the present specification is not limited to the illustrated embodiments. The disclosure encompasses the illustrated embodiments and variations of the embodiments by those skilled in the art. For example, the disclosure is not limited to the combination of elements shown in the embodiments. The disclosure may be implemented in various combinations. The disclosed technical scope is not limited to the description of the embodiments. The several technical ranges disclosed are indicated by the description of the claims, and should be construed to include all modifications within the meaning and range equivalent to the description of the claims.

Although an example in which the semiconductor module 10 is applied to the inverter 5 has been described, the present disclosure is not limited to the above example. For example, the present disclosure can be applied to a boost converter. The present disclosure can also be applied to both the inverter 5 and the boost converter.

Although the freewheel diodes 12a and 12a are formed integrally with the IGBTs 12 and 13, the present disclosure is not limited to the above example. The freewheel diodes 12a and 12a may be provided as separate chips.

Although examples of the IGBTs 12 and 13 are shown as the switching elements, the switching elements are not limited to the above example. A switching element having a gate electrode, a first main electrode and a second main electrode through which a main current flows may be used. For example, a MOSFET may be employed. The present disclosure is not limited to a vertical switching element, and can be applied to a horizontal switching element (for example, a LDMOS).

Although an example in which the terminal 17 is provided as the semiconductor module 10 having a double-sided heat radiation structure has been described, the present disclosure is not limited to the above example. A configuration without the terminal 17 may also be employed. For example, instead of the terminal 17, the second heat sink 19 may be provided with a projection portion projecting toward the emitter electrode 14c. In addition, the heat radiation surfaces 15a and 19a has been presented as an example of being exposed from the sealing resin body 11, but the heat radiation surfaces 15 and 19a may not been exposed from the sealing resin body 11. Furthermore, the sealing resin body 11 may not be provided.

Figure 16:
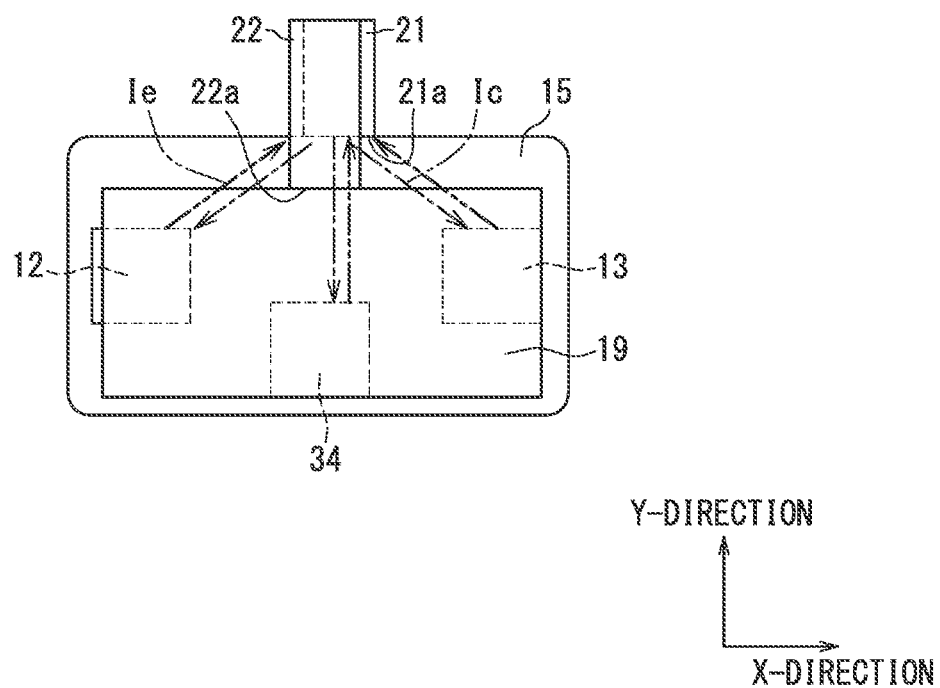
FIG. 16 is a plan view showing a sixth modification.

The example in which the semiconductor module 10 includes the two IGBTs 12 and 13 connected in parallel, but are not limited to this example. The present disclosure is also applicable to a configuration in which three or more IGBTs are connected in parallel. For example, in a sixth modification shown in FIG. 16, three IGBTs 12, 13 and 34 are provided. The collector electrodes 14b of the IGBTs 12 and 13, and 34 are connected to the same first heat sink 15, and the emitter electrodes 14c of the IGBTs 12 and 13, and 34 are connected to the same second heat sink 19.

As described above, even in the configuration in which three or more IGBTs 12, 13, and 34 are connected in parallel, if the self-inductance of an arbitrary current path which is the second current path of any of IGBTs is denoted by Lsn, the mutual inductance of the arbitrary current path and other current paths except for the arbitrary current path is denoted by Mn, and the sum of the self-inductance Lsn and the mutual inductance Mn is denoted by Ln, the multiple IGBTs and the multiple current paths may be disposed so that the inductance sum Ln of each of the IGBTs is equal to each other.

What is claimed is:
1. A semiconductor module comprising:
two switching elements each including a first main electrode formed on one surface side, and a second main electrode and a gate electrode formed on a rear surface side opposite to the one surface side, disposed side by side in such a manner that the respective one surfaces are disposed on a same side, and connected in parallel to each other;

two first main terminals and a second main terminal serving as external connection terminals; and
a first conductor plate to which the two first main terminals are coupled and both the first main electrodes of the two switching elements are electrically connected, and a second conductor plate to which the second main terminal is coupled and both the second main electrodes of the two switching elements are electrically connected, wherein
a second coupling portion, which is a coupling portion between the second main terminal and the second conductor plate, is disposed between the two switching elements in an alignment direction of the two switching elements, and
first coupling portions, which are coupling portions between the respective first main terminals and the first conductor plate, are provided on both sides of the second coupling portion in the alignment direction.

2. The semiconductor module according to claim 1, wherein
the two first main terminals and the first conductor plate are provided integrally.

3. The semiconductor module according to claim 1, wherein
the second main terminal and the second conductor plate are provided integrally.

4. The semiconductor module according to claim 1, further comprising
a first current path formed between each of the first main electrodes and each of the first main terminals, and a second current path formed between each of the second main electrodes and the second main terminal, serving as current paths between the first main terminals and the second main terminal through each of the switching elements, wherein
when a self-inductance of an arbitrary current path, which is the second current path of any of the switching elements is denoted as Lsn, a mutual inductance of the arbitrary current path and other current paths except for the arbitrary current path is denoted as Mn, and a sum of Lsn and Mn is denoted as Ln, the switching elements and the current paths are disposed in such a manner that Ln of each of the switching elements is equal to each other.

5. The semiconductor module according to claim 4, wherein
the two switching elements includes a first switching element and a second switching element,
when a self-inductance and a mutual inductance of the second current path of the first switching element are respectively denoted as Ls1 and M1, and a self-inductance and a mutual inductance of the second current path of the second switching element are respectively denoted as Ls2 and M2, the switching elements and the current paths are disposed to satisfy M1=M2 in a case of Ls1=Ls2.

6. A semiconductor module comprising:
two switching elements each including a first main electrode formed on one surface side, and a second main electrode and a gate electrode formed on a rear surface side opposite to the one surface side, disposed side by side in such a manner that the respective one surfaces are disposed on a same side, and connected in parallel to each other;
a first main terminal and two second main terminals serving as external connection terminals; and
a first conductor plate to which the first main terminal is coupled and both the first main electrodes of the two switching elements are electrically connected, and a second conductor plate to which two of the second main terminals are coupled and both the second main electrodes of the two switching elements are electrically connected, wherein
a first coupling portion, which is a coupling portion between the first main terminal and the first conductor plate, is disposed between the two switching elements in an alignment direction of the two switching elements, and
second coupling portions, which are coupling portions between the respective second main terminals and the second conductor plate, are provided on both sides of the first coupling portion in the alignment direction.

7. The semiconductor module according to claim 6, further comprising
a first current path formed between each of the first main electrodes and the first main terminal, and a second current path formed between each of the second main electrodes and each of the second main terminals, serving as current paths between the first main terminal and the second main terminals through each of the switching elements, wherein
when a self-inductance of an arbitrary current path, which is the second current path of any of the switching elements is denoted as Lsn, a mutual inductance of the arbitrary current path and other current paths except for the arbitrary current path is denoted as Mn, and a sum of Lsn and Mn is denoted as Ln, the switching elements and the current paths are disposed in such a manner that Ln of each of the switching elements is equal to each other.

8. The semiconductor module according to claim 7, wherein
the two switching elements includes a first switching element and a second switching element,
when a self-inductance and a mutual inductance of the second current path of the first switching element are respectively denoted as Ls1 and M1, and a self-inductance and a mutual inductance of the second current path of the second switching element are respectively denoted as Ls2 and M2, the switching elements and the current paths are disposed to satisfy M1=M2 in a case of Ls1=Ls2.

9. A semiconductor module comprising:
two switching elements including a gate electrode, and a first main electrode and a second main electrode through which a main current flows;
a first main terminal and a second main terminal serving as external connection terminals;
a first conductor portion to which the first main terminal is coupled and both the first main electrodes of the two switching elements are electrically connected; and
a second conductor portion to which the second main terminal is coupled and both the second main electrodes of the two switching elements are electrically connected, wherein
a first coupling portion, which is a coupling portion between the first main terminal and the first conductor portion, and a second coupling portion, which is a coupling portion between the second main terminal and the second conductor portion, are disposed only between the two switching elements in an alignment direction of the two switching elements.

10. The semiconductor module according to claim 9, further comprising
a first current path formed between each of the first main electrodes and the first main terminal, and a second current path formed between each of the second main electrodes and the second main terminal, serving as current paths between the first main terminal and the second main terminal through each of the switching elements, wherein
when a self-inductance of an arbitrary current path, which is the second current path of any of the switching elements is denoted as Lsn, a mutual inductance of the arbitrary current path and other current paths except for the arbitrary current path is denoted as Mn, and a sum of Lsn and Mn is denoted as Ln, the switching elements and the current paths are disposed in such a manner that Ln of each of the switching elements is equal to each other.

11. The semiconductor module according to claim 7, wherein
the two switching elements includes a first switching element and a second switching element,
when a self-inductance and a mutual inductance of the second current path of the first switching element are respectively denoted as $Ls1$ and $M1$, and a self-inductance and a mutual inductance of the second current path of the second switching element are respectively denoted as $Ls2$ and $M2$, the switching elements and the current paths are disposed to satisfy $M1=M2$ in a case of $Ls1=Ls2$.

12. The semiconductor module according to claim 1, wherein
the first main electrodes of the two switching elements are electrically connected to the first conductor plate that is a single conductor plate, and
the second main electrodes of the two switching elements are electrically connected to the second conductor plate that is a single conductor plate.

13. The semiconductor module according to claim 6, wherein
the first main electrodes of the two switching elements are electrically connected to the first conductor plate that is a single conductor plate, and
the second main electrodes of the two switching elements are electrically connected to the second conductor plate that is a single conductor plate.

14. The semiconductor module according to claim 9, wherein
the first main electrodes of the two switching elements are electrically connected to the first conductor plate that is a single conductor plate, and
the second main electrodes of the two switching elements are electrically connected to the second conductor plate that is a single conductor plate.

* * * * *